(12) United States Patent
Xue et al.

(10) Patent No.: US 10,170,069 B2
(45) Date of Patent: Jan. 1, 2019

(54) SHIFT REGISTER, DRIVING METHOD THEREOF AND GATE DRIVING DEVICE HAVING STABLE OUTPUT

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Wei Xue, Beijing (CN); Hongmin Li, Beijing (CN); Ping Song, Beijing (CN); Zhifu Dong, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/680,441

(22) Filed: Aug. 18, 2017

(65) Prior Publication Data

US 2018/0190232 A1 Jul. 5, 2018

(30) Foreign Application Priority Data

Jan. 3, 2017 (CN) .......................... 2017 1 0002347

(51) Int. Cl.
*G09G 3/30* (2006.01)
*G09G 3/36* (2006.01)
*G11C 19/28* (2006.01)

(52) U.S. Cl.
CPC ... *G09G 3/3677* (2013.01); *G09G 2300/0408* (2013.01); *G09G 2300/0426* (2013.01);
(Continued)

(58) Field of Classification Search
CPC ........ G09G 2310/0286; G09G 3/3674–3/3681
See application file for complete search history.

(56) References Cited

U.S. PATENT DOCUMENTS

| 8,223,111 | B2 | 7/2012 | Liao et al. |
| 9,613,583 | B2 | 4/2017 | Shao et al. |

(Continued)

FOREIGN PATENT DOCUMENTS

| CN | 101533623 A | 9/2009 |
| CN | 102708926 A | 10/2012 |

(Continued)

OTHER PUBLICATIONS

First Chinese Office Action dated Jul. 3, 2018, for corresponding Chinese Application No. 201710002347.3.

*Primary Examiner* — Sanghyuk Park
(74) *Attorney, Agent, or Firm* — Kinney & Lange, P.A.

(57) ABSTRACT

A shift register includes an input circuit, a first reset circuit, an output circuit, a second reset circuit and a first pull-down control circuit. The input circuit may control a voltage of the first node according to a reset signal from a reset signal terminal. The first reset circuit may reset the voltage of the first node according to the reset signal from the reset signal terminal. The output circuit may control an output signal of a signal output terminal according to the voltage of the first node. The second reset circuit may reset the voltage of the first node and the output signal according to a voltage of a second node. The first pull-down control circuit may control the voltage of the second node according to the voltage of the first node based on a first auxiliary voltage signal and a second auxiliary voltage signal, wherein a phase of the first auxiliary voltage signal is opposite to a phase of the second auxiliary voltage signal, and each duty cycles is 50%.

16 Claims, 7 Drawing Sheets

(52) U.S. Cl.
CPC . *G09G 2310/0286* (2013.01); *G09G 2310/08* (2013.01); *G09G 2320/043* (2013.01); *G09G 2330/02* (2013.01); *G11C 19/28* (2013.01)

(56) References Cited

U.S. PATENT DOCUMENTS

| | | | |
|---|---|---|---|
| 2006/0256066 A1* | 11/2006 | Moon | G09G 3/3677 345/100 |
| 2010/0231497 A1 | 9/2010 | Liao et al. | |
| 2010/0316182 A1* | 12/2010 | Lai | G11C 19/28 377/79 |
| 2011/0002438 A1* | 1/2011 | Kim | G11C 19/28 377/67 |
| 2012/0256817 A1 | 10/2012 | Chen et al. | |
| 2014/0079173 A1 | 3/2014 | Yan et al. | |
| 2015/0002504 A1* | 1/2015 | Jo | G09G 3/3677 345/213 |
| 2016/0049128 A1 | 2/2016 | Shao et al. | |

FOREIGN PATENT DOCUMENTS

| | | |
|---|---|---|
| CN | 103700356 A | 4/2014 |
| JP | 2010218673 A | 9/2010 |

* cited by examiner

SHIFT REGISTER, DRIVING METHOD THEREOF AND GATE DRIVING DEVICE HAVING STABLE OUTPUT

CROSS-REFERENCE TO RELATED APPLICATION(S)

This application claims priority to a Chinese application No. CN201710002347.3, filed on Jan. 3, 2017 and entitled "Shift Register, Driving Method thereof and Gate Driving Device", which is incorporated herein by reference in its entirety.

TECHNICAL FIELD

The present disclosure relates to the field of display technology, and more particularly, to a shift register, a driving method thereof, a gate driving device, an array substrate and a display device.

BACKGROUND

A liquid crystal display (referred to as LCD) has advantages such as low radiation, a small size and low energy consumption, etc., and thus is widely used in a notebook, a flat-screen TV or a mobile phone and other electronic products. The LCD is composed of pixel cells which are arranged in a matrix form. When the LCD is displaying, display data and a clock signal which are input may be latched through a data driving circuit by timing, and may be converted into analog signals which are then input to a data line of a liquid crystal panel. A gate driving circuit may convert the input clock signal through a shift register into a voltage that controls turn-on/turn-off of the pixel cells, and apply the voltage to gate lines of the LCD line by line.

In order to reduce production cost of the LCD, the existing gate driving circuit usually uses Gate Driver on Array (referred to as GOA) technology for integrating a thin film transistor (TFT) gate switch circuit on an array substrate of a display panel to achieve scan driving for the display panel. Such a gate driving circuit which is integrated on the array substrate using the GOA technology is also referred to as a GOA circuit or a shift register circuit. A display device with the GOA circuit may reduce costs in terms of material cost and a manufacturing process due to a portion of binding the driving circuit being omitted.

SUMMARY

Embodiments of the present disclosure provide a shift register and a driving method thereof, a gate driving device, a substrate and a display device.

According to an aspect of an embodiment of the present disclosure, a shift register is provided, comprising an input circuit, a first reset circuit, an output circuit, a second reset circuit and a first pull-down control circuit. The input circuit is coupled to a signal input terminal, a first voltage signal terminal and a first node; and configured to supply a first voltage signal from the first voltage signal terminal to the first node according to an input signal from the signal input terminal. The first reset circuit is coupled to a reset signal terminal, a second voltage signal terminal and the first node; and configured to supply a second reset signal from the second voltage signal terminal to the first node according to a reset signal from the reset signal terminal, so as to reset a voltage of the first node. The output circuit is coupled to a clock signal terminal, a signal output terminal and the first node; and configured to supply a clock signal from the clock signal terminal to the signal output terminal as an output signal, according to the voltage of the first node. The second reset circuit is coupled to a third voltage signal terminal, the first node, a second node and the signal output terminal; and configured to supply a third voltage signal from the third voltage signal terminal to the first node and the signal output terminal according to a voltage of the second node, so as to reset the voltage of the first node and the output signal. The first pull-down control circuit is coupled to the third voltage signal terminal, the first node, the second node, a first auxiliary voltage signal terminal and a second auxiliary voltage signal terminal; and configured to control the voltage of the second node according to the voltage of the first node. A phase of a first auxiliary voltage signal from the first auxiliary voltage signal terminal is opposite to that of a second auxiliary voltage signal from the second auxiliary voltage signal terminal, and each duty ratio is 50%.

In an embodiment of the present disclosure, the input circuit may comprise a first transistor having a control electrode coupled to the signal input terminal, a first electrode coupled to the first voltage signal terminal, and a second electrode coupled to the first node.

In an embodiment of the present disclosure, the first reset circuit may comprise a second transistor having a control electrode coupled to the reset signal terminal, a first electrode coupled to the second voltage signal terminal, and a second electrode coupled to the first node.

In an embodiment of the present disclosure, the output circuit may comprise a third transistor and a first capacitor. The third transistor has a control electrode coupled to the first node, a first electrode coupled to the clock signal terminal, and a second electrode coupled to the signal output terminal. The first capacitor is coupled between the first node and the signal output terminal.

In an embodiment of the present disclosure, the second reset circuit may comprise a fourth transistor and a fifth transistor. The fourth transistor has a control electrode coupled to the second node, a first electrode coupled to the third voltage signal terminal, and a second electrode coupled to the first node. The fifth transistor has a control electrode coupled to the second node, a first electrode coupled to the third voltage signal terminal, and a second electrode coupled to the signal output terminal.

In an embodiment of the present disclosure, the first pull-down control circuit may comprise a sixth transistor, a seventh transistor and an eighth transistor. The eighth transistor has a control electrode and a first electrode both coupled to the first auxiliary voltage signal terminal, and a second electrode coupled to the second node. The sixth transistor has a control electrode coupled to the first node, a first electrode coupled to the third voltage signal terminal, and a second electrode coupled to the second node. The seventh transistor has a control electrode and a first electrode both coupled to the second auxiliary voltage signal terminal, and a second electrode coupled to the second node.

In an embodiment of the present disclosure, a width-to-length ratio of the seventh transistor is identical with a width-to-length ratio of the eighth transistor. A width-to-length ratio of the sixth transistor is an integral multiple of the width-to-length ratios of the seventh transistor and the eighth transistor.

In an embodiment of the present disclosure, the first pull-down control circuit may further comprise a ninth transistor. The ninth transistor has a control electrode coupled to the first node, a first electrode coupled to the third voltage signal terminal, and a second electrode coupled to the second node. A width-to-length ratio of the ninth transistor is identical with the width-to-length ratio of the sixth transistor.

In an embodiment of the present disclosure, the shift register may further comprise a second pull-down control circuit, which is coupled to the second node and a start signal terminal, and configured to control a voltage of the second node according to a start signal from the start signal terminal.

In an embodiment of the present disclosure, the second pull-down control circuit may comprise a tenth transistor having a control electrode and a first electrode both coupled to the start signal terminal, and a second electrode coupled to the second node.

According to another aspect of the present disclosure, a method of driving a shift register is provided. In a first time period, the input signal is supplied by the signal input terminal to the input circuit so as to turn the input circuit on; the first voltage signal is output by the first voltage signal terminal to the first node through the input circuit so as to turn the output circuit on; the clock signal terminal outputs the clock signal to the signal output terminal through the output circuit; and the first pull-down control circuit controls the voltage of the second node according to the second auxiliary voltage signal supplied by the second auxiliary signal terminal and the third voltage signal supplied by the third voltage signal terminal. In a second time period, the output circuit is kept being turned on to output the clock signal to the signal output terminal; and the voltage of the second node is controlled by the first pull-down control circuit according to the first auxiliary voltage signal supplied by the first auxiliary voltage signal terminal and the third voltage signal. In a third time period, the reset signal is supplied by the reset signal terminal to the first reset circuit so as to turn the first reset circuit on, and the voltage of the first node is reset to turn the output circuit off; and the second auxiliary voltage signal is supplied to the second node so as to turn the second reset circuit on to reset the voltages of the first node and the signal output terminal. In a fourth time period, the first auxiliary voltage signal is supplied to the second node to keep the second reset circuit being turned on. In a fifth time period, the second auxiliary voltage signal is supplied to the second node to keep the second reset circuit being turned on.

In an embodiment of the present disclosure, the first voltage signal terminal outputs a second voltage signal, and a second voltage signal terminal outputs the first voltage signal. In addition, the reset signal is supplied to the signal input terminal, and the input signal is supplied to the reset signal terminal.

In an embodiment of the present disclosure, the shift register may further comprise a start signal terminal. Before a start of each frame, a start signal is supplied by the start signal terminal to the second pull-down control circuit so as to turn the second pull-down control circuit on; the start signal is supplied to the second node so as to turn the second reset circuit on; and the third voltage signal is supplied by the third voltage signal terminal to the first node and the signal output terminal through the second reset circuit.

According to another aspect of the present disclosure, a gate driving device is provided. The gate driving device comprises a plurality of cascaded shift registers, wherein each stage of shift register is the shift register as described above. In the gate driving device, a start signal is supplied to the signal input terminal of a first stage of shift register, the signal input terminal of each of respective stages, other than the first stage, of shift registers is coupled to the signal output terminal of a previous stage of shift register, and the reset signal terminal of each of the respective stages of the shift registers is coupled to the signal output terminal of a next stage of shift register.

In an embodiment of the present disclosure, each stage of shift register further comprises a start signal terminal, and the gate driving device is configured to, before a start of each frame, supply a start signal by the start signal terminal to the second pull-down control circuit so as to turn the second pull-down control circuit on; and supply the start signal to the second node so as to turn the second reset circuit on to reset the first node and the signal output terminal.

The shift register according to the embodiments of the present disclosure can use only fewer components to reduce noise at the signal output terminal, so that the gate driving circuit may be protected to work stably for a long time.

BRIEF DESCRIPTION OF THE DRAWINGS

In order to more clearly illustrate the technical solution in the embodiments of the present disclosure, the following drawings of the embodiments will be briefly explained. It should be noted that the drawings are only some embodiments of the present disclosure, but are not limitations on the present disclosure, in which.

DETAILED DESCRIPTION

In order to further clarify objects and advantages of embodiments of the present disclosure, the technical solutions of the embodiments of the present disclosure will be further described clearly and completely with reference to the accompanying drawings. Obviously, the described embodiments are merely a part of the embodiments of the present disclosure, but not all of the embodiments. All other embodiments which may be obtained by those skilled in the art based on the described embodiments without creative labor fall into the scope of the present disclosure.

Hereinafter, unless specifically stated, an expression of "an element A being coupled to an element B" means that the element A is "directly" connected to the element B or is "indirectly" connected to the element B through one or more other elements.

Figure 1:
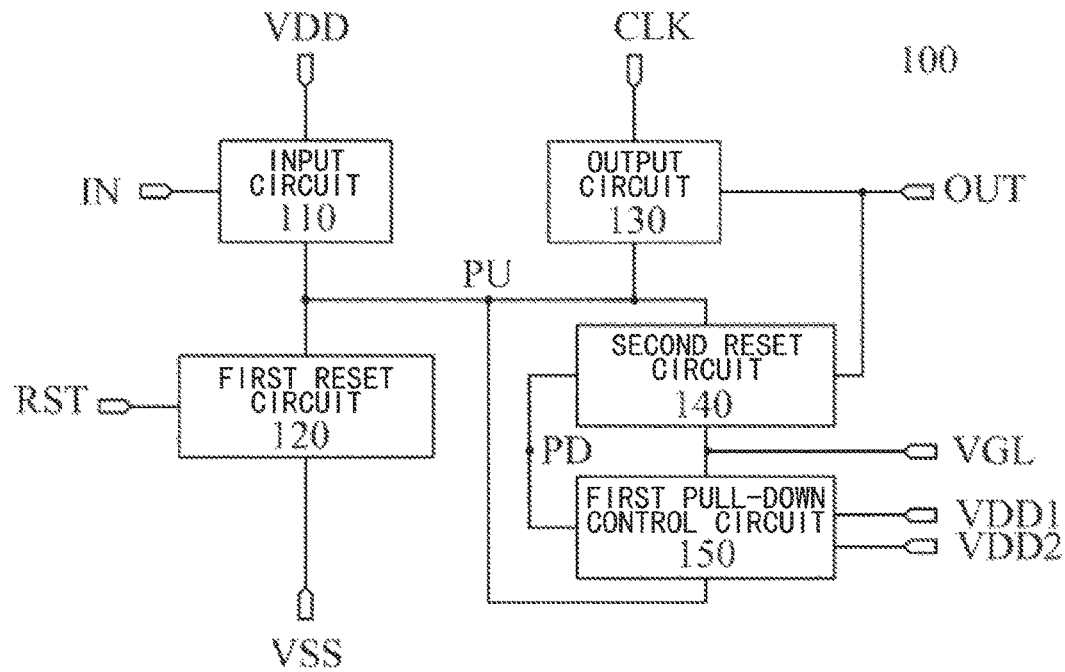
FIG. 1 is a schematic diagram of a shift register according to an embodiment of the present disclosure.

FIG. 1 is a schematic diagram of a shift register 100 according to an embodiment of the present disclosure. As shown in FIG. 1, the shift register 100 may comprise an input circuit 110, a first reset circuit 120, an output circuit 130, a second reset circuit 140 and a first pull-down control circuit 150.

The input circuit 110 may be coupled to a first voltage signal terminal VDD, a signal input terminal IN and a first node PU. The input circuit 110 may supply a first voltage signal Vdd from the first voltage signal terminal VDD to the first node PU (also referred to as a "pull-up node") under control of an input signal INPUT from the signal input terminal IN.

The first reset circuit 120 may be coupled to the first node PU, a second voltage signal terminal VSS and a reset signal terminal RST. The first reset circuit 120 may supply a second reset signal Vss from the second voltage signal terminal VSS to the first node PU under control of a reset signal RESET from the reset signal terminal RST, so as to reset a voltage of the first node PU.

The output circuit 130 may be coupled to the first node PU, a clock signal terminal CLK and a signal output terminal OUT. The output circuit 130 may control an output signal OUTPUT of the signal output terminal OUT under control of the voltage of the first node PU. When the output circuit 130 is turned on, a clock signal from the clock signal terminal CLK is output to the signal output terminal OUT.

The second reset circuit 140 may be coupled to a third voltage signal terminal VGL, the first node PU, a second node PD (also referred to as a "pull-down node") and the signal output terminal OUT. The second reset circuit 140 may supply a third voltage signal Vg1 from the third voltage signal terminal VGL to the first node PU and the signal output terminal OUT under control of a voltage of the second node PD, so as to reset the voltage of the first node PU and the output signal OUTPUT.

The first pull-down control circuit 150 may be coupled to the first node PU, the second node PD, the third voltage signal terminal VGL, a first auxiliary voltage signal terminal VDD1 and a second auxiliary voltage signal terminal VDD2. The first pull-down control circuit 150 may control the voltage of the second node PD according to the voltage of the first node PU. In particular, when the voltage of the first node PU is a high level voltage, the voltage of the second node PD is controlled by the first pull-down control circuit 150 to be at a low level. When the voltage of the first node PU is a low level voltage, the voltage of the second node PD is controlled by the first pull-down control circuit 150 to be a high level voltage.

In an embodiment of the present disclosure, a first auxiliary voltage signal Vdd1 from the first auxiliary voltage signal terminal VDD1 and a second auxiliary voltage signal Vdd2 from the second auxiliary voltage signal terminal VDD2 have identical amplitudes and opposite phases, and each of their duty ratios is 50%.

Figure 2:
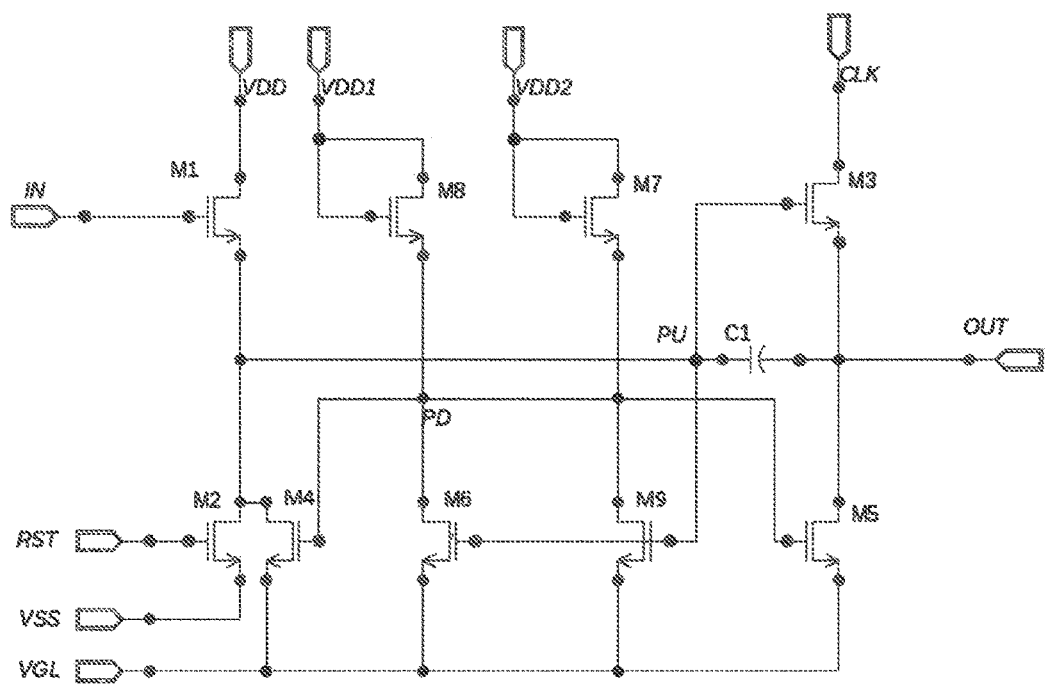
FIG. 2 is a circuit diagram of the shift register as shown in FIG. 1.

FIG. 2 is a circuit diagram of the shift register 100 as shown in FIG. 1. In an embodiment of the present disclosure, transistors in the shift register 100 may be N-type transistors or P-type transistors. In particular, the transistor may be an N-type or P-type field effect transistor (MOSFET), or an N-type or P-type bipolar transistor (BJT). In an embodiment of the present disclosure, a gate of the transistor is referred to as a control electrode. Since a source and a drain of the transistor are symmetrical, the source and the drain may not be distinguished, i.e., the source of the transistor may be a first electrode (or a second electrode), and the drain may be a second electrode (or a first electrode). Further, functions of the transistor may be implemented by any controlled switching device having a gated signal input, a controlled middle terminal of the switching device for receiving a control signal (e.g. for enabling and disabling the controlled switching device) being referred to as the control terminal, and two other terminals being referred to as the first electrode and the second electrode, respectively.

In the example of FIG. 2, all of the transistors are N-type transistors. Therefore, the first voltage signal Vdd supplied by the first voltage signal terminal VDD is a high-level signal, the second voltage signal Vss supplied by the second voltage signal terminal VSS is a low-level signal, and the third voltage signal Vg1 supplied by the third voltage signal terminal VGL is a low-level signal. The second voltage signal terminal VSS and the third voltage signal terminal VGL are not connected. As shown in FIG. 2, the input circuit 110 may comprise a first transistor M1. The first transistor M1 has a control electrode coupled to the signal input terminal IN, a first electrode is coupled to the first voltage signal terminal VDD, and a second electrode is coupled to the first node PU.

The first reset circuit 120 may comprise a second transistor M2. The second transistor M2 has a control electrode coupled to the reset signal terminal RST, a first electrode coupled to the second voltage signal terminal VSS and a second electrode coupled to the first node PU.

The output circuit 130 may comprise a third transistor M3 and a first capacitor C1. The third transistor M3 has a control electrode coupled to the first node PU, a first electrode coupled to the clock signal terminal CLK and a second electrode coupled to the signal output terminal OUT. One terminal of the first capacitor C1 is coupled to the first node PU, and the other terminal of the first capacitor C1 is coupled to the signal output terminal.

The second reset circuit 140 may comprise a fourth transistor M4 and a fifth transistor M5. The fourth transistor M4 has a control electrode coupled to the second node PD, a first electrode coupled to the third voltage signal terminal VGL and a second electrode coupled to the first node PU. The fifth transistor M5 has a control electrode coupled to the second node PD, a first electrode coupled to the third voltage signal terminal VGL and a second electrode coupled to the signal output terminal OUT.

The first pull-down control circuit 150 may comprise an eighth transistor M8, a sixth transistor M6 and a seventh transistor M7. The eighth transistor M8 has a control electrode and a first electrode both coupled to the first auxiliary voltage signal terminal VDD1, and a second electrode coupled to the second node PD. The sixth transistor M6 has a control electrode coupled to the first node PU, a first electrode coupled to the third voltage signal terminal VGL, and a second electrode coupled to the second node PD. The seventh transistor M7 has a control electrode and a first electrode both coupled to the second auxiliary voltage signal terminal VDD2, and a second electrode coupled to the second node PD.

In an embodiment of the present disclosure, a width-to-length ratio of the seventh transistor M7 is identical with a width-to-length ratio of the eighth transistor M8. A width-to-length ratio of the sixth transistor M6 is an integral multiple of the width-to-length ratios of the seventh transistor M7 and the eighth transistor M8.

In an embodiment of the present disclosure, the first pull-down control circuit 150 may further comprise a ninth transistor M9. Same as the configuration of the sixth transistor M6, the ninth transistor M9 has a control electrode coupled to the first node PU, a first electrode coupled to the third voltage signal terminal VGL, and a second electrode coupled to the second node PD. In addition, a width-tolength ratio of the ninth transistor M9 is identical with the width-to-length ratio of the sixth transistor M6.

In addition, in an embodiment in which all of the transistors in the shift register 100 are P-type transistors, the first voltage signal Vdd changes to be a low-level signal, the second voltage signal Vss changes to be a high-level signal, and the third voltage signal Vg1 changes to be a high-level signal.

Figure 3:
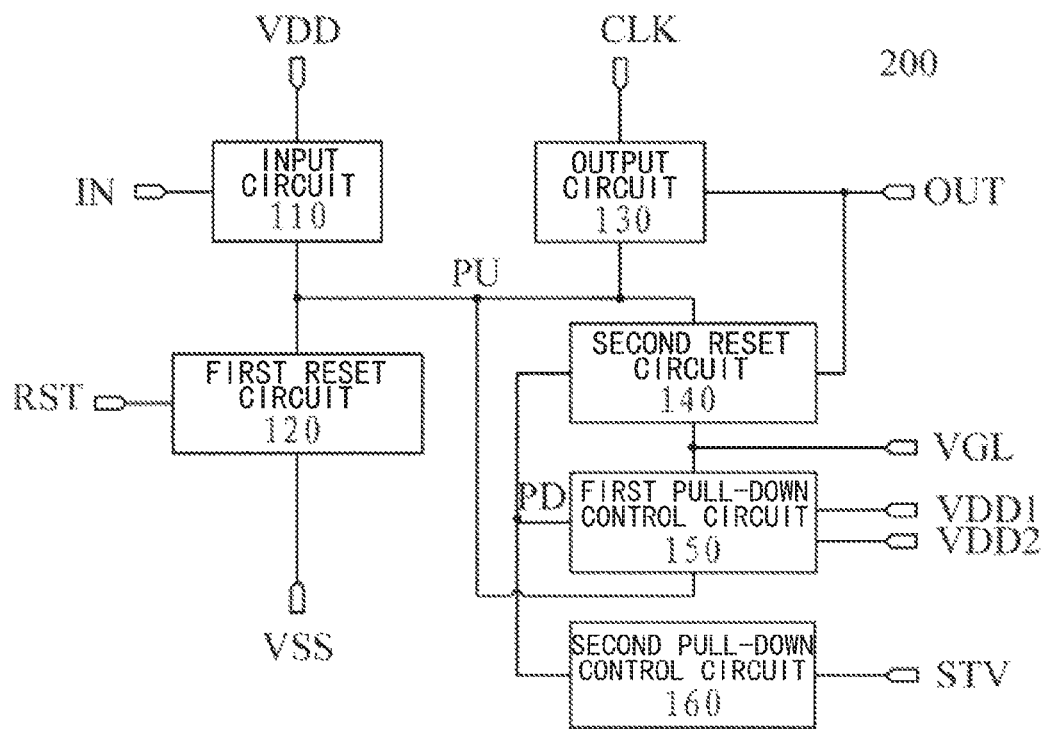
FIG. 3 is a schematic diagram of a shift register according to another embodiment of the present disclosure.

FIG. 3 is a schematic diagram of a shift register 200 according to another embodiment of the present disclosure. As shown in FIG. 3, in addition to the configuration shown in the shift register 100 in FIG. 1, the shift register 200 may further comprise a second pull-down control circuit 160. The second pull-down control circuit 160 may be coupled to the second node PD and a start signal terminal STV, and supply a start signal stv from the start signal terminal STV to the second node PD in order to reset the voltage of the first node PD and the voltage of the signal output terminal OUT. Therefore, when the second pull-down control circuit 160 is turned on, the voltage of the second node PD changes to be identical with the voltage of the start signal stv. At this time, the second reset circuit 140 is turned on so as to reset the voltages of the first node PU and the signal output terminal OUT.

Figure 4:
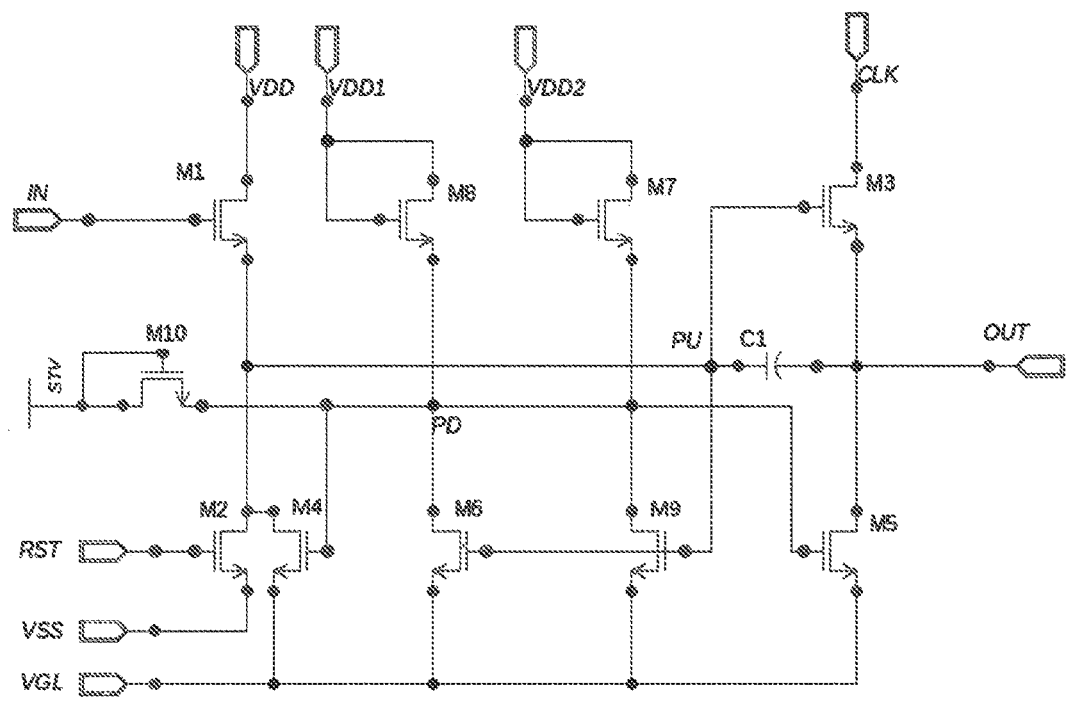
FIG. 4 is a circuit diagram of the shift register as shown in FIG. 3.

FIG. 4 is a circuit diagram of the shift register 200 as shown in FIG. 3. As shown in FIG. 4, in addition to the configuration of the circuit diagram of the shift register 100 as shown in FIG. 2, the second pull-down control circuit 160 in the shift register 200 as shown in FIG. 3 may comprise a tenth transistor M10. The tenth transistor M10 has a control electrode and a first electrode both coupled to the start signal terminal STV, and a second electrode coupled to the second node PD.

In an embodiment of the present disclosure, the tenth transistor M10 may be an N-type transistor. In this case, when the start signal terminal STV supplies a start signal stv at the high level, the tenth transistor M10 is turned on, and the voltage of the second node changes to the high level, so as to turn on the fourth transistor M4 and the fifth transistor M5 which are N-type transistors, and reset the voltages of the first node PU and the signal output terminal OUT.

In an embodiment of the present disclosure, the tenth transistor M10 may be a P-type transistor. In this case, when the start signal terminal STV supplies a start signal stv at the low level, the tenth transistor M10 is turned on, and the voltage of the second node changes to the low level, so as to turn on the fourth transistor M4 and the fifth transistor M5 which are P-type transistors, and reset the voltages of the first node PU and the signal output terminal OUT.

Figure 5:
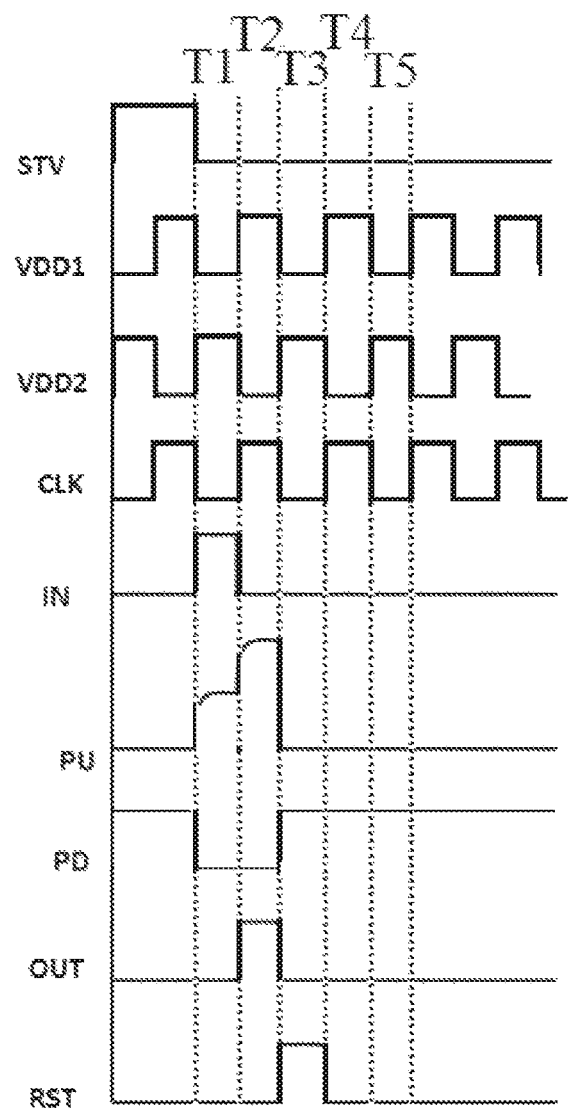
FIG. 5 is a timing sequence diagram of respective signals of a shift register according to an embodiment of the present disclosure.

Hereinafter, operation processes of the shift registers 100 and 200 in FIGS. 2 and 4 during forward scanning are respectively described in detail, in conjunction with a timing sequence diagram as shown in FIG. 5.

The following description takes all of the transistors in the shift registers being N-type transistors as an example. In this case, the first voltage signal Vdd is a high-level signal, the second voltage signal Vss is a low-level signal, and the third voltage signal Vg1 is also a low-level signal.

The operation process of the shift register 100 as shown in FIG. 2 during a forward scanning is described as follows.

In a first time period (T1), the first auxiliary voltage signal Vdd1 of the first auxiliary voltage signal terminal VDD1 is at the low level, the second auxiliary voltage signal Vdd2 of the second auxiliary voltage signal terminal VDD2 is at the high level, the clock signal of the clock signal terminal CLK is at the low level, the input signal INPUT is at the high level, and the reset signal RESET is at the low level. During T1, the first transistor M1 is turned on, the input signal INPUT charges the first capacitor C1, the voltage of the first node PU rises up to the high level. In addition, the third transistor M3 is turned on, so that the signal output terminal OUT outputs the clock signal CLK with the low level as the output signal OUTPUT. On the other hand, the seventh transistor M7 and the ninth transistor M9 are in an on state, and the eighth transistor M8 is in an off state. By controlling a ratio of the width-to-length (W/L) ratios of the seventh transistor M7 and the ninth transistor M9, the voltage of the second node PD is set to the low level. For example, the width-to-length ratio of the ninth transistor M9 is set to be an integral multiple of the width-to-length ratio of the seventh transistor M7. To be a specific example, e.g. a length of the seventh transistor M7 is set to be equal to a length of the ninth transistor M9, and a width of the seventh transistor M7 is set to be an integral multiple of a width of the ninth transistor M9. In addition, the fourth transistor M4 and the fifth transistor M5 are in an off state, guaranteeing the signal being output stably.

In a second time period (T2), the first auxiliary voltage signal Vdd1 of the first auxiliary voltage signal terminal VDD1 is at the high level, the second auxiliary voltage signal Vdd2 of the second auxiliary voltage signal terminal VDD2 is at the low level, the clock signal of the clock signal terminal CLK is at the high level, the input signal INPUT is at the low level, and the reset signal RESET is at the low level. During T2, the first transistor M1 is turned off, and the first capacitor C1 is discharged, the voltage of the first node PU being further pulled up due to bootstrapping. Since the voltage of the first node PU is further increased on a basis of the first time period and the third transistor M3 is kept in the on state, the signal output terminal OUT outputs the clock signal with the high level, i.e., the signal output terminal outputs the output signal OUTPUT for driving gate lines. On the other hand, the eighth transistor M8 and the sixth transistor M6 are in the on state, and the seventh transistor is in the off state. As described above, by controlling a ratio of the width-to-length (W/L) ratios of the eighth transistor M8 and the sixth transistor M6, the voltage of the second node PD is set to the low level. For example, the width-to-length ratio of the sixth transistor M6 is set to be an integral multiple of the width-to-length ratio of the eighth transistor M8. As a specific example, a length of the eighth transistor M8 is set to be equal to a length of the sixth transistor M6, and a width of the sixth transistor M6 is set to be an integral multiple of a width of the eighth transistor M8. In addition, the fourth transistor M4 and the fifth transistor M5 are in the off state, guaranteeing the signal being output stably.

In a third time period (T3), the first auxiliary voltage signal Vdd1 of the first auxiliary voltage signal terminal VDD1 is at the low level, the second auxiliary voltage signal Vdd2 of the second auxiliary voltage signal terminal VDD2 is at the high level, the clock signal of the clock signal terminal CLK is at the low level, the input signal INPUT is at the low level, and the reset signal RESET is at the high level. During T3, the second transistor M2 is turned on, so that the voltage of the first node PU is reset to the low level, and in turn the third transistor M3 is turned off. On the other hand, the sixth transistor M6 and the ninth transistor M9 are in the off state, and do not discharge the second node PD anymore. The seventh transistor M7 is turned on to set the second node PD to the high level. As a result, the fourth transistor M4 and the fifth transistor M5 are in the on state, and the first node PU and the signal output terminal OUT are kept at the low level again.

In a fourth time period (T4), the first auxiliary voltage signal Vdd1 of the first auxiliary voltage signal terminal VDD1 is at the high level, the second auxiliary voltage signal Vdd2 of the second auxiliary voltage signal terminal VDD2 is at the low level, the clock signal of the clock signal terminal CLK is at the high level, the input signal INPUT is at the low level, and the reset signal RESET is at the low level. During T4, the voltage of the first node PU is kept at the low level, and the sixth transistor M6 and the ninth transistor M9 are kept in the off state. The eighth transistor M8 is turned on to keep the second node PD at the high level. As a result, the fourth transistor M4 and the fifth transistor M5 are kept in the on state, and the first node PU and the signal output terminal OUT are further kept at the low level.

In a fifth time period (T5), the first auxiliary voltage signal Vdd1 of the first auxiliary voltage signal terminal VDD1 is at the low level, the second auxiliary voltage signal Vdd2 of the second auxiliary voltage signal terminal VDD2 is at the high level, the clock signal of the clock signal terminal CLK is at the low level, the input signal INPUT is at the low level, and the reset signal RESET is at the low level. During T5, the voltage of the first node PU is kept at the low level, and the sixth transistor M6 and the ninth transistor M9 are kept in the off state. The seventh transistor M7 is turned on to keep the second node PD at the high level. As a result, the fourth transistor M4 and the fifth transistor M5 are kept in the on state, and the first node PU and the signal output terminal OUT are further kept at the low level.

In subsequent time periods, the shift register repeats the operations of the fourth time period (T4) and the fifth time period (T5) as described above sequentially, so that the voltage of the first node PU and the output signal of the signal output terminal are kept at the low level, until the shift register receives a high-level input signal INPUT at the signal input terminal IN.

In summary, one of the seventh transistor M7 and the eighth transistor M8 is in the on state and the other is in the off state, based on the fact that the first auxiliary voltage signal Vdd1 and the second auxiliary voltage signal Vdd2 have identical amplitudes, opposite phases and 50% duty ratios. The seventh transistor M7 and the eighth transistor M8 are alternately in the high-level on state, increasing the lives of the transistors.

When the voltage of the first node PU is at the high level, by controlling the ratio of the width-to-length ratio of one of the eighth transistor M8 and the seventh transistor M7 which is in the on state to the width-to-length ratio of the sixth transistor M6 (or the ninth transistor M9), the voltage of the second node PD is controlled at the low level.

When the voltage of the first node PU is at the low level, since the sixth transistor M6 and the ninth transistor M9 are both in the off state, the voltage of the second node PD cannot be discharged, and the voltage of the second node PD is in the high-level state according to one of the eighth transistor M8 and the seventh transistor M7 which is in the on state. Therefore, the phases of the first auxiliary voltage signal Vdd1 and the second auxiliary voltage signal Vdd2 are always opposite, so that the second node PD is kept at the high level, and the voltage of the first node PU and the signal output terminal are further set to be at the low level by the fourth transistor M4 and the fifth transistor M5, so that cyclic noise release is performed on the voltages of the signal output terminal OUT and the first node PU, thereby eliminating the noise at the output terminal, improving the work stability and prolonging the life.

The GOA technology has inherent problems in terms of a working life and output stability etc. In a design for the GOA of a product, how to use fewer circuit components to achieve functions of the shift register and reduce noise at an output terminal to keep the gate driving circuit work stably for a long time is a critical problem for the GOA design. Since fewer transistors are used in the shift register of the embodiments of the present disclosure, a narrow bezel design of the liquid crystal display can be realized. In addition, there is no defect of degradation of interlaced display effect at a high temperature.

On the other hand, the clock signal of the clock signal terminal CLK has no correlation with the first auxiliary voltage signal Vdd1 and the second auxiliary voltage signal Vdd2. Therefore, the duty ratio of the clock signal of the clock signal terminal CLK may be freely set, so as to avoid occurrence of black and white lines and high temperature jitter defects at the bottom.

In addition, the respective transistors may also be P-type transistors. In addition to that potentials of the respective levels are reversed, the operation process of the shift register with P-type transistors is similar with that of the shift register with the N-type transistors, and thus the description thereof will be omitted here for simplicity.

In addition to the above-described operation process of the shift register 100, the operation process of the shift register 200 as shown in FIG. 4 during the forward scanning further comprises a process of resetting the shift register 200 by the start signal stv supplied from the start signal terminal STV at the start of each frame. Taking all of the transistors in the shift register 200 being N-type transistors as an example, before the start of each frame, the start signal stv with the high level is input to the start signal terminal STV. At this time, the tenth transistor M10 is turned on, the voltage of the second node changes to the high level, so as to turn on the fourth transistor M4 and the fifth transistor M5 to reset the voltages of the first node and the signal output terminal. Therefore, by supplying the start signal stv before the start of each frame to reset the voltage of the signal output terminal, it is possible to eliminate a defect of white lines at bottom due to abnormal power-off of the circuit.

On the other hand, all of the transistors in the shift register 200 may also be P-type transistors. In this case, the operation process of the shift register is similar with that of the shift register with the N-type transistors, except that the potentials of the respective levels are reversed. Thus the description thereof will be omitted here for simplicity.

Figure 6:
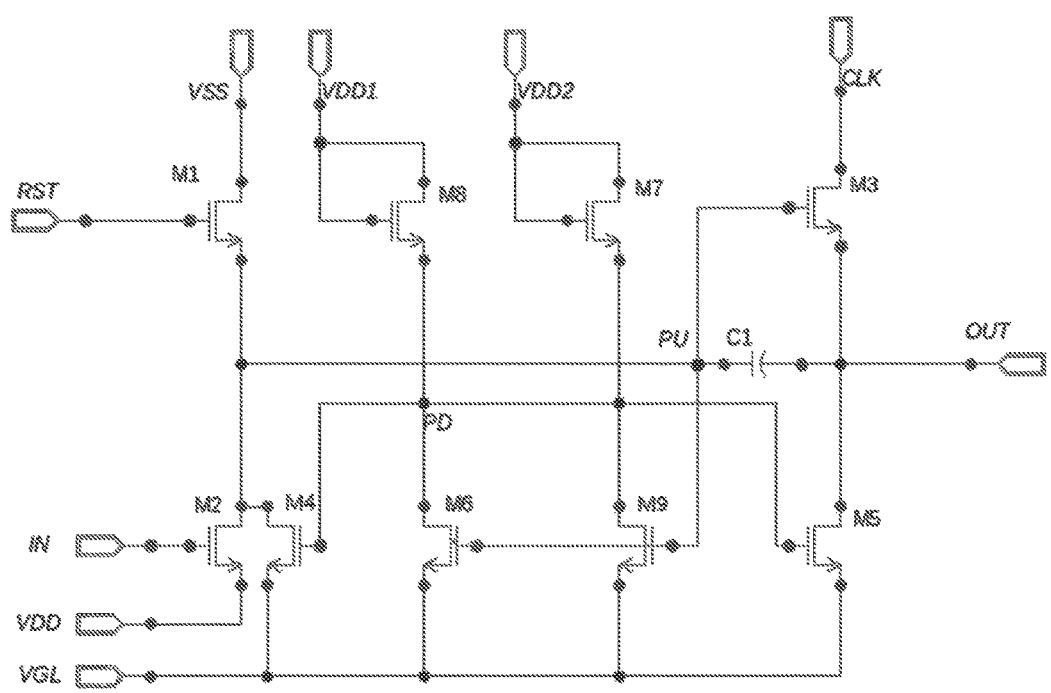
FIG. 6 is a circuit diagram of the shift register as shown in FIG. 2 used for backward scanning.

FIG. 6 shows an exemplary circuit diagram of the shift register 100 as shown in FIG. 1 during backward scanning. Similar with the schematic circuit diagram of the shift register in FIG. 2 during the forward scanning, the difference consists in that the signal input terminal IN of the shift register in FIG. 6 is equivalent to the reset signal terminal RST of the shift register in FIG. 2, the reset signal terminal RST of the shift register in FIG. 6 is equivalent to the signal input terminal IN of the shift register in FIG. 2, the first voltage signal terminal VDD of the shift register in FIG. 6 is equivalent to the second voltage signal terminal VSS of the shift register in FIG. 2, and the second voltage signal terminal VSS of the shift register in FIG. 6 is equivalent to the first voltage signal terminal VDD of the shift register in FIG. 2.

Specifically, in the backward scanning, the second transistor M2 constitutes the input circuit 110. The second transistor M2 has a control electrode coupled to the signal input terminal IN, a first electrode coupled to the first voltage signal terminal VDD, and a second electrode coupled to the first node PU.

The first transistor M1 constitutes the first reset circuit 120. The first transistor M1 has a control electrode coupled to the reset signal terminal RST, a first electrode coupled to the second voltage signal terminal VSS, and a second electrode coupled to the first node PU.

In addition, the configurations of the output circuit 130, the second reset circuit 140, the pull-up control circuit 150 and the pull-down control circuit 160 in the backward scanning are identical with those of the forward scanning, and thus description thereof will be omitted here for simplicity.

It will be appreciated by those skilled in the art that the operation process of the disclosed shift register during the backward scanning is similar with that of the shift register during the forward scanning. Hereinafter, N-type transistors are taken as an example for illustration in detail.

Particularly, in the first time period (T1), the first auxiliary voltage signal Vdd1 of the first auxiliary voltage signal terminal VDD1 is at the low level, the second auxiliary voltage signal Vdd2 of the second auxiliary voltage signal terminal VDD2 is at the high level, the clock signal of the clock signal terminal CLK is at the low level, the input signal INPUT is at the high level, and the reset signal RESET is at the low level. During T1, the second transistor M2 is turned on, the input signal INPUT charges the first capacitor C1, the voltage of the first node PU rises up to the high level. In addition, the third transistor is turned on, so that the signal output terminal OUT outputs the clock signal CLK with the low level as the output signal OUTPUT. On the other hand, the seventh transistor M7 and the ninth transistor M9 are in an on state, and the eighth transistor M8 is in an off state. By controlling the ratio of the width-to-length (W/L) ratios of the seventh transistor M7 and the ninth transistor M9, the voltage of the second node PD is set to the low level. For example, the width-to-length ratio of the ninth transistor M9 is set to be the integral multiple of the width-to-length ratio of the seventh transistor M7. As a specific example, the length of the seventh transistor M7 is set to be equal to the length of the ninth transistor M9, and the width of the seventh transistor M7 is set to be the integral multiple of the width of the ninth transistor M9. In addition, the fourth transistor M4 and the fifth transistor M5 are in the turn-off state, guaranteeing the signal being output stably.

In the second time period (T2), the first auxiliary voltage signal Vdd1 of the first auxiliary voltage signal terminal VDD1 is at the high level, the second auxiliary voltage signal Vdd2 of the second auxiliary voltage signal terminal VDD2 is at the low level, the clock signal of the clock signal terminal CLK is at the high level, the input signal INPUT is at the low level, and the reset signal RESET is at the low level. During T2, the second transistor M2 is turned off, and the first capacitor C1 is discharged, the voltage of the first node PU being further pulled up due to the bootstrapping. Since the voltage of the first node PU is further increased on the basis of the first time period and the third transistor M3 is kept in the turn-on state, the signal output terminal OUT outputs the clock signal with the high level, i.e., the signal output terminal outputs the output signal OUTPUT for driving the gate lines. On the other hand, the eighth transistor M8 and the sixth transistor M6 are in the on state, and the seventh transistor is in the off state. As described above, by controlling the ratio of the width-to-length (W/L) ratios of the eighth transistor M8 and the sixth transistor M6, the voltage of the second node PD is set to the low level. For example, the width-to-length ratio of the sixth transistor M6 is set to be the integral multiple of the width-to-length ratio of the eighth transistor M8. As a specific example, the length of the eighth transistor M8 is set to be equal to the length of the sixth transistor M6, and the width of the sixth transistor M6 is set to be the integral multiple of the width of the eighth transistor M8. In addition, the fourth transistor M4 and the fifth transistor M5 are in the off state, guaranteeing the signal being output stably.

In a third time period (T3), the first auxiliary voltage signal Vdd1 of the first auxiliary voltage signal terminal VDD1 is at the low level, the second auxiliary voltage signal Vdd2 of the second auxiliary voltage signal terminal VDD2 is at the high level, the clock signal of the clock signal terminal CLK is at the low level, the input signal INPUT is at the low level, and the reset signal RESET is at the high level. During T3, the first transistor M1 is turned on, so that the voltage of the first node PU is reset to the low level, and in turn the third transistor M3 is turned off. On the other hand, the sixth transistor M6 and the ninth transistor M9 are in the off state, and do not discharge the second node PD anymore. The seventh transistor M7 is turned on to set the second node PD to the high level. As a result, the fourth transistor M4 and the fifth transistor M5 are in the on state, and the first node PU and the signal output terminal OUT are kept at the low level again.

In addition, operations in the fourth time period (T4) and the fifth time period (T5) during the backward scanning are similar with those during the forward scanning operation in FIG. 3, and thus description thereof will be omitted here. In an embodiment of the present disclosure, the disclosed shift register during the backward scanning can also keep the voltages of the first node PU and the signal output terminal OUT at the low level during a non-output state, thereby eliminating the noise.

In the backward scanning, the start signal of the start signal terminal can also be set to the high level before the start of each frame. The voltage of the second node PD is pulled high so as to ensure that the voltages of the first node PU and the signal output terminal OUT are kept at the low level.

On the other hand, P-type transistors may also be used. In addition to the potentials of the respective levels are reversed, the operation process of the shift register is similar with that of the shift register with the N-type transistors, and thus description thereof will be omitted here for simplicity.

Figure 7:
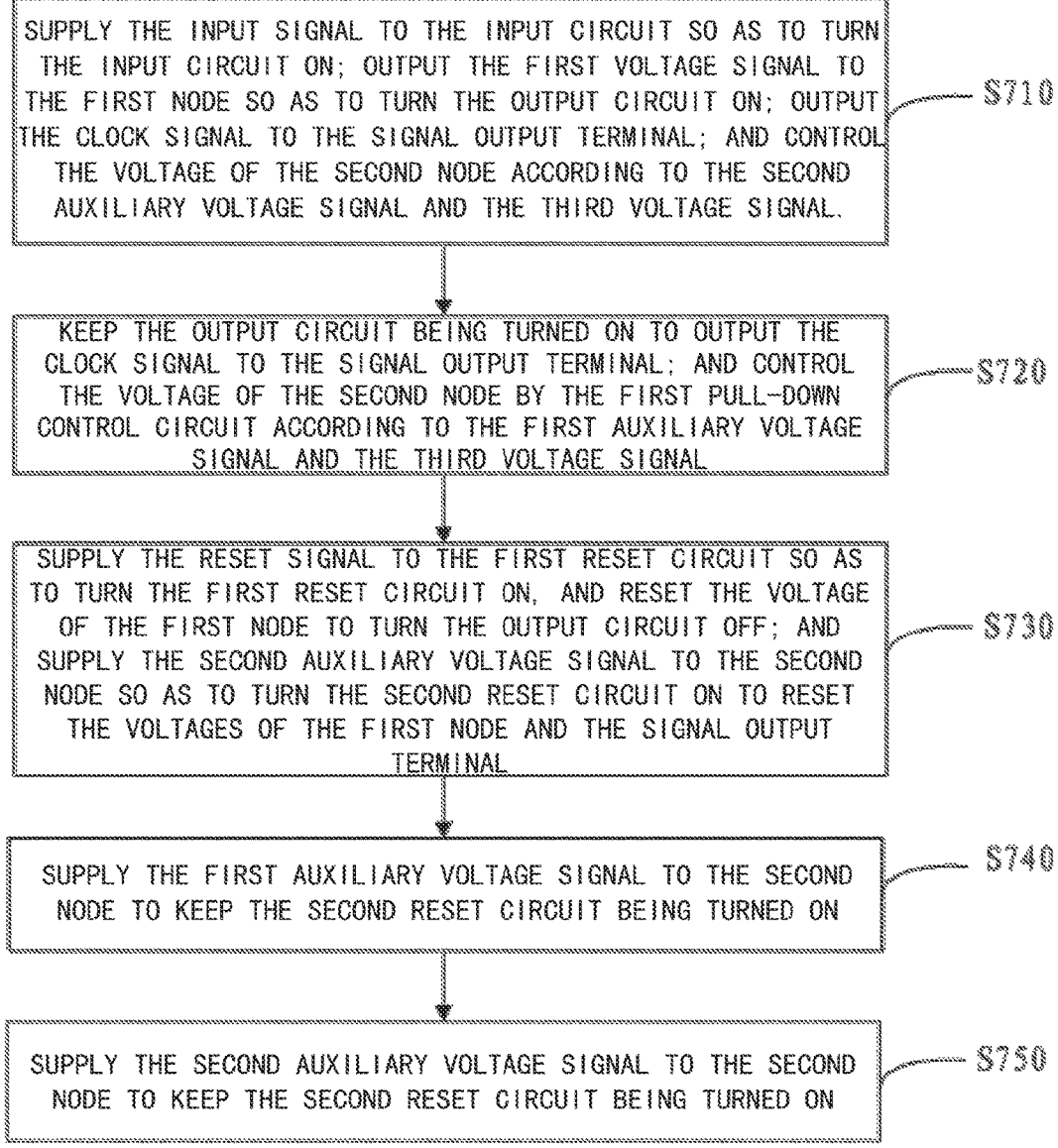
FIG. 7 is a schematic flowchart of a method of driving a shift register according to an embodiment of the present disclosure.

FIG. 7 is a schematic flowchart of a method of driving the shift register 100 as shown in FIG. 1 according to an embodiment of the present disclosure.

In step S710, the input signal is supplied by the signal input terminal to the input circuit so as to turn the input circuit on; the first voltage signal is output by the first voltage signal terminal to the first node through the input circuit so as to turn the output circuit on; the clock signal terminal outputs the clock signal to the signal output terminal through the output circuit; and the first pull-down control circuit controls the voltage of the second node according to the second auxiliary voltage signal supplied by the second auxiliary signal terminal and the third voltage signal supplied by the third voltage signal terminal.

In step S720, the output circuit is kept being turned on to output the clock signal to the signal output terminal; and the voltage of the second node is controlled by the first pull-down control circuit according to the first auxiliary voltage signal supplied by the first auxiliary voltage signal terminal and the third voltage signal.

In step S730, the reset signal is supplied by the reset signal terminal to the first reset circuit so as to turn the first reset circuit on, and the voltage of the first node is reset to turn the output circuit off; the second auxiliary voltage signal is supplied to the second node so as to turn the second reset circuit on; and the third voltage signal Vg1 is supplied to the first node and the signal output terminal to reset the voltages of the first node and the signal output terminal.

In step S740, the first auxiliary voltage signal is supplied to the second node to keep the second reset circuit being turned on.

In step S750, the second auxiliary voltage signal is supplied to the second node to keep the second reset circuit being turned on.

As such, the first auxiliary voltage signal at the first auxiliary voltage signal terminal and the second auxiliary voltage signal at the second auxiliary voltage signal terminal are alternately controlled in steps S740 and S750, so as to keep the second reset circuit being turned on, thereby maintaining the third voltage signal being supplied to the first node and the signal output terminal.

The above describes the schematic flowchart of the method of driving the shift register 100 during the forward scanning. As will be understood by those skilled in the art, a process of a method of driving the shift register 100 during the backward scanning is similar to the above process. The only difference being that the second voltage signal Vss during the forward scanning is supplied to the first voltage signal terminal VDD, the first voltage signal Vdd during the forward scanning is supplied to the second voltage signal terminal VSS, the reset signal during the forward scanning is supplied to the signal input terminal, and the input signal during the forward scanning is supplied to the reset signal terminal RST. That is, during the forward scanning, the reset signal (i.e., the signal provided on the reset signal terminal) is active during the third time period and the input signal (i.e., the signal provided on the input signal terminal) is active during the first time period, while during the backward scanning, the reset signal (i.e., the signal provided on the reset signal terminal) is active during the first time period and the input signal (i.e., the signal provided on the input signal terminal) is active during the third time period. Here, an active signal is a high level signal for an N-type transistor, and a low level signal for a P-type transistor. Therefore, detailed description thereof will be omitted for simplicity.

Figure 8:
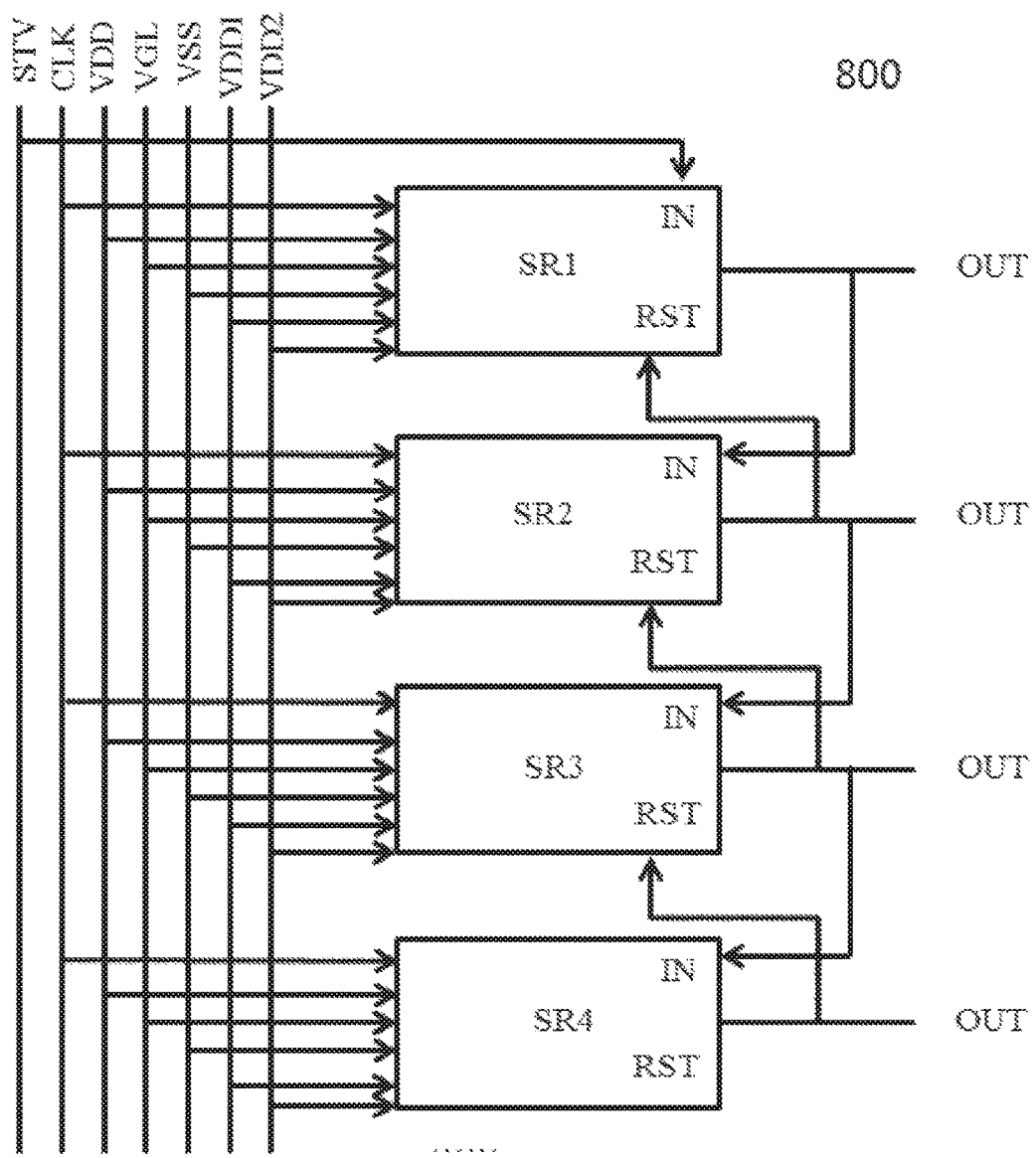
FIG. 8 is a structure diagram of a gate driving device of the shift register as shown in FIG. 2.

FIG. 8 is an exemplary structure diagram of a gate driving device 800 according to an embodiment of the present disclosure. As shown in FIG. 8, the gate driving device 800 may include N+1 cascaded shift registers SR1, SR2, . . . , SRn, SR(n+1), wherein each stage of shift register may use the structure of the shift register as described above.

In the gate driving device 800, terminals of each stage of shift register may comprise the first voltage signal terminal VDD, the second voltage signal terminal VSS, the third voltage signal terminal VGL, the first auxiliary voltage signal terminal VDD1, the second auxiliary voltage signal terminal VDD2, the clock signal input terminal CLK, the signal input terminal IN, the reset signal terminal RST, and the signal output terminal OUT.

The signal output terminal OUT of each stage of shift register SRn is coupled to the signal input terminal IN of a next stage of shift register SR(n+1), the reset signal terminal RST of each stage of shift register SRn is coupled to the signal output terminal OUT of the next stage of shift register SR(n+1), and the signal input terminal IN of the first stage of shift register inputs a frame start signal STV. For example, the reset signal terminal RST of the first stage of shift register SR1 receives the output signal from the signal output terminal OUT of the second stage of shift register SR2 as the reset signal of the first stage of shift register SR1. The signal input terminal IN of the second stage of shift register SR2 receives the output signal from the signal output terminal OUT of the first stage of shift register SR1 as the input signal of the second stage of shift register SR1.

In addition, the first auxiliary voltage signal from the first auxiliary voltage signal terminal VDD1 and the second auxiliary voltage signal from the second auxiliary voltage signal terminal VDD2 have identical amplitudes and opposite phases, and each of their duty ratios is 50%.

Figure 9:
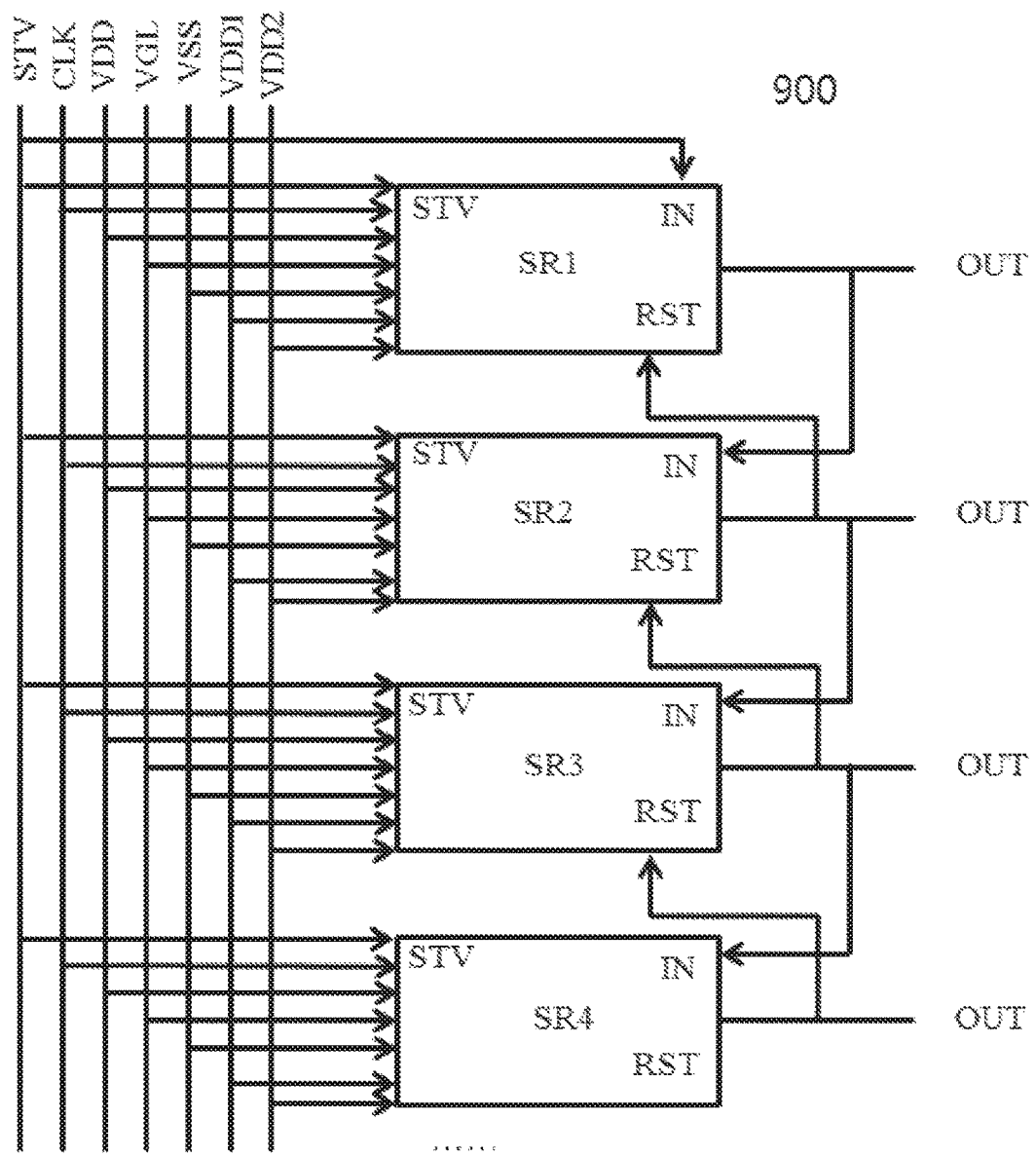
FIG. 9 is a structure diagram of a gate driving device of the shift register as shown in FIG. 4.

The gate driving device 900 as shown in FIG. 9 has a start signal terminal STV in addition to the same configuration as the gate driving device 800 as shown in FIG. 8. The gate driving device 900 is configured to, before the start of each frame, supply the start signal by the start signal terminal to the second pull-down control circuit so as to turn the second pull-down control circuit on; and supply the start signal to the second node so as to turn the second reset circuit on to reset the first node and the signal output terminal. Therefore, by supplying the start signal stv before the start of each frame to reset the voltage of the signal output terminal, it is possible to eliminate a defect of white lines at bottom due to abnormal power-off of the circuit.

Although several embodiments of the present disclosure have been described in detail, the protection scope of present disclosure is not limited to this. It will be apparent to the skilled in the art that various modifications, substitutions or variations may be made to the embodiments of the present disclosure without departing from the spirit and scope of the present disclosure. The scope of the present disclosure is defined by the appended claims.

We claim:

1. A shift register, comprising:
an input circuit, coupled to a signal input terminal, a first voltage signal terminal and a first node, and configured to supply a first voltage signal from the first voltage signal terminal to the first node according to an input signal from the signal input terminal;
a first reset circuit, coupled to a reset signal terminal, a second voltage signal terminal and the first node, and configured to supply a first reset signal from the second voltage signal terminal to the first node according to a second reset signal from the reset signal terminal, so as to reset a voltage of the first node;
an output circuit, coupled to a clock signal terminal, a signal output terminal and the first node, and configured to supply a clock signal from the clock signal terminal to the signal output terminal as an output signal, according to the voltage of the first node;
a second reset circuit, coupled to a third voltage signal terminal, the first node, a second node and the signal output terminal, and configured to supply a third voltage signal from the third voltage signal terminal to the first node and the signal output terminal according to a voltage of the second node, so as to reset the voltage of the first node and the output signal; and
a first pull-down control circuit, coupled to the first node, the second node, the third voltage signal terminal, a first auxiliary voltage signal terminal and a second auxiliary voltage signal terminal, and configured to control the voltage of the second node according to the voltage of the first node;
wherein a phase of a first auxiliary voltage signal from the first auxiliary voltage signal terminal is opposite to that of a second auxiliary voltage signal from the second auxiliary voltage signal terminal, each with a duty ratio of 50%, and wherein the first pull-down control circuit comprises:
a sixth transistor having a control electrode coupled to the first node, a first electrode coupled to the third voltage signal terminal, and a second electrode coupled to the second node;
a seventh transistor having a control electrode and a first electrode both coupled to the second auxiliary voltage signal terminal, and a second electrode coupled to the second node; and
an eighth transistor having a control electrode and a first electrode both coupled to the first auxiliary voltage signal terminal, and a second electrode coupled to the second node, and
wherein a width-to-length ratio of the seventh transistor is identical with a width-to-length ratio of the eighth transistor; and
a width-to-length ratio of the sixth transistor is an integral multiple of the width-to-length ratios of the seventh transistor and the eighth transistor.

2. The shift register according to claim 1, wherein the input circuit comprises:
a first transistor having a control electrode coupled to the signal input terminal, a first electrode coupled to the first voltage signal terminal, and a second electrode coupled to the first node.

3. The shift register according to claim 2, wherein the first reset circuit comprises:
a second transistor having a control electrode coupled to the reset signal terminal, a first electrode coupled to the second voltage signal terminal, and a second electrode coupled to the first node.

4. The shift register according to claim 3, wherein the output circuit comprises:
a third transistor having a control electrode coupled to the first node, a first electrode coupled to the clock signal terminal, and a second electrode coupled to the signal output terminal; and
a first capacitor coupled between the first node and the signal output terminal.

5. The shift register according to claim 4, wherein the second reset circuit comprises:
a fourth transistor having a control electrode coupled to the second node, a first electrode coupled to the third voltage signal terminal, and a second electrode coupled to the first node; and
a fifth transistor having a control electrode coupled to the second node, a first electrode coupled to the third voltage signal terminal, and a second electrode coupled to the signal output terminal.

6. The shift register according to claim 1, wherein the first pull-down control circuit further comprises:
a ninth transistor having a control electrode coupled to the first node, a first electrode coupled to the third voltage signal terminal, and a second electrode coupled to the second node;
wherein a width-to-length ratio of the ninth transistor is identical with the width-to-length ratio of the sixth transistor.

7. The shift register according to claim 6, further comprising:
a second pull-down control circuit, coupled to the second node and a start signal terminal, and configured to control a voltage of the second node according to a start signal from the start signal terminal.

8. The shift register according to claim 7, wherein the second pull-down control circuit comprises:
a tenth transistor having a control electrode and a first electrode both coupled to the start signal terminal, and a second electrode coupled to the second node.

9. A method of driving the shift register according to claim 8, comprising:
in a first time period, supplying, by the signal input terminal, the input signal to the input circuit so as to turn the input circuit on; outputting, by the first voltage signal terminal, the first voltage signal to the first node through the input circuit so as to turn the output circuit on; outputting, by the clock signal terminal, the clock signal to the signal output terminal through the output circuit; and controlling, by the first pull-down control circuit, the voltage of the second node according to the second auxiliary voltage signal supplied by the second auxiliary signal terminal and the third voltage signal supplied by the third voltage signal terminal;
in a second time period, keeping the output circuit turned on to output the clock signal to the signal output terminal; and controlling the voltage of the second node by the first pull-down control circuit according to the first auxiliary voltage signal supplied by the first auxiliary voltage signal terminal and the third voltage signal;
in a third time period, supplying, by the reset signal terminal, the reset signal to the first reset circuit so as to turn the first reset circuit on, and resetting the voltage of the first node to turn the output circuit off; and supplying the second auxiliary voltage signal to the second node so as to turn the second reset circuit on to reset the voltages of the first node and the signal output terminal;
in a fourth time period, supplying the first auxiliary voltage signal to the second node to keep the second reset circuit turned on;
in a fifth time period, supplying the second auxiliary voltage signal to the second node to keep the second reset circuit turned on; and
before a start of each frame, supplying the start signal by the start signal terminal to the second pull-down control circuit to turn the second pull-down control circuit on, the start signal being supplied to the second node so as to turn the second reset circuit on to reset the voltages of the first node and the signal output terminal.

10. A method of driving the shift register according to claim 7, comprising:
in a first time period, supplying, by the signal input terminal, the input signal to the input circuit so as to turn the input circuit on; outputting, by the first voltage signal terminal, the first voltage signal to the first node through the input circuit so as to turn the output circuit on; outputting, by the clock signal terminal, the clock signal to the signal output terminal through the output circuit; and controlling, by the first pull-down control circuit, the voltage of the second node according to the second auxiliary voltage signal supplied by the second auxiliary signal terminal and the third voltage signal supplied by the third voltage signal terminal;
in a second time period, keeping the output circuit turned on to output the clock signal to the signal output terminal; and controlling the voltage of the second node by the first pull-down control circuit according to the first auxiliary voltage signal supplied by the first auxiliary voltage signal terminal and the third voltage signal;

in a third time period, supplying, by the reset signal terminal, the reset signal to the first reset circuit so as to turn the first reset circuit on, and resetting the voltage of the first node to turn the output circuit off; and supplying the second auxiliary voltage signal to the second node so as to turn the second reset circuit on to reset the voltages of the first node and the signal output terminal;

in a fourth time period, supplying the first auxiliary voltage signal to the second node to keep the second reset circuit turned on;

in a fifth time period, supplying the second auxiliary voltage signal to the second node to keep the second reset circuit turned on; and before a start of each frame, supplying the start signal by the start signal terminal to the second pull-down control circuit so as to turn the second pull-down control circuit on, the start signal being supplied to the second node so as to turn the second reset circuit on to reset the voltages of the first node and the signal output terminal.

11. A method of driving the shift register according to claim 1, comprising:

in a first time period, supplying, by the signal input terminal, the input signal to the input circuit so as to turn the input circuit on; outputting, by the first voltage signal terminal, the first voltage signal to the first node through the input circuit so as to turn the output circuit on; outputting, by the clock signal terminal, the clock signal to the signal output terminal through the output circuit; and controlling, by the first pull-down control circuit, the voltage of the second node according to the second auxiliary voltage signal supplied by the second auxiliary signal terminal and the third voltage signal supplied by the third voltage signal terminal;

in a second time period, keeping the output circuit turned on to output the clock signal to the signal output terminal; and controlling the voltage of the second node by the first pull-down control circuit according to the first auxiliary voltage signal supplied by the first auxiliary voltage signal terminal and the third voltage signal;

in a third time period, supplying, by the reset signal terminal, the reset signal to the first reset circuit so as to turn the first reset circuit on, and resetting the voltage of the first node to turn the output circuit off; and supplying the second auxiliary voltage signal to the second node so as to turn the second reset circuit on to reset the voltages of the first node and the signal output terminal;

in a fourth time period, supplying the first auxiliary voltage signal to the second node to keep the second reset circuit turned on; and in a fifth time period, supplying the second auxiliary voltage signal to the second node to keep the second reset circuit turned on.

12. The method according to claim 11, wherein the first voltage signal is at a high level, the second voltage signal is at a low level, the input signal is active during the first time period, and the reset signal is active during the third time period; or the first voltage signal is at a low level, the second voltage signal is at a high level, the input signal is active during the third time period, and the reset signal is active during the first time period.

13. A gate driving device, comprising a plurality of cascaded shift registers, wherein each stage of shift register is the shift register according to claim 1, wherein a start signal is supplied to the signal input terminal of a first stage of shift register, the signal input terminal of each of the respective stages, other than the first stage, of the shift registers is coupled to the signal output terminal of a previous stage of shift register, and the reset signal terminal of each of the respective stages of the shift registers is coupled to the signal output terminal of a next stage of shift register.

14. The gate driving device according to claim 13, wherein each stage of shift register further comprises a start signal terminal, wherein the gate driving device is configured to, before a start of each frame, supply the start signal to the start signal terminals of the respective stages of the shift registers for controlling the voltage of the second node of each of the respective stages of the shift registers to be at a high level and the voltage of the first node and the output signal of each of the respective stages of the shift registers to be at a low level.

15. The shift register according to claim 1, further comprising:

a second pull-down control circuit, coupled to the second node and a start signal terminal, and configured to control a voltage of the second node based on a start signal from the start signal terminal.

16. The shift register according to claim 15, wherein the second pull-down control circuit comprises:

a transistor having a control electrode and a first electrode both coupled to the start signal terminal, and a second electrode coupled to the second node.

* * * * *